(12) United States Patent
Takano et al.

(10) Patent No.: US 7,635,862 B2
(45) Date of Patent: Dec. 22, 2009

(54) ANISOTROPIC CONDUCTIVE ADHESIVE, ELECTRODE CONNECTION STRUCTURE AND METHOD USING THE ADHESIVE

(75) Inventors: Daijiro Takano, Komatsu (JP); Hikaru Fujita, Kanazawa (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 369 days.

(21) Appl. No.: 11/337,000

(22) Filed: Jan. 23, 2006

(65) Prior Publication Data

US 2006/0194425 A1 Aug. 31, 2006

(30) Foreign Application Priority Data

Jan. 31, 2005 (JP) .............. 2005-023922

(51) Int. Cl.
*H01L 29/04* (2006.01)
*H01L 31/20* (2006.01)
*H01L 31/036* (2006.01)
*H01L 31/0376* (2006.01)
*H01L 31/12* (2006.01)

(52) U.S. Cl. .............. 257/59; 257/72; 257/13; 257/79

(58) Field of Classification Search .............. 438/618; 257/72, 59, 13, 79, 252, 257, 291
See application file for complete search history.

(56) References Cited

U.S. PATENT DOCUMENTS 5,001,302 A * 3/1991 Atsumi .............. 174/94 R
6,981,317 B1 * 1/2006 Nishida .............. 29/840

FOREIGN PATENT DOCUMENTS

JP 10-274778 10/1998
JP 2003-272445 * 9/2003

* cited by examiner

*Primary Examiner*—Chuong A. Luu
(74) *Attorney, Agent, or Firm*—Oblon, Spivak, McClelland, Maier & Neustadt, L.L.P.

(57) ABSTRACT

Anisotropic conductive adhesive has conductive particles dispersed in adhesive and includes hard particles having conductivity, a resin layer that coats the hard particles and a conductive layer that coats the resin layer. A connection structure electrically connects electrodes to each other with the anisotropic conductive adhesive. A connection method includes the steps of causing the anisotropic conductive to intervene between electrodes, applying pressure to the anisotropic conductive adhesive and allowing the adhesive to be solidified.

2 Claims, 3 Drawing Sheets

(a)

(b)

PRIOR ART

ANISOTROPIC CONDUCTIVE ADHESIVE, ELECTRODE CONNECTION STRUCTURE AND METHOD USING THE ADHESIVE

BACKGROUND OF THE INVENTION

1. Field of the Invention

The present invention relates to anisotropic conductive adhesive used when connecting a flexible wiring board to a panel electrode of a liquid crystal display unit, for example, and further to a connection structure and connection method of the electrode using the anisotropic conductive adhesive.

2. Description of the Prior Art

Since a liquid crystal display unit, for example, is a planar display unit having excellent properties, such as small thickness, light weight, low power consumption, etc., it is put to a wide range of applications to mobile devices, such as a Personal Digital Assistance (so-called PDA), a portable telephone, etc., to the display of a personal computer, etc.

The liquid crystal display unit has a liquid crystal panel of a structure having a liquid crystal layer sandwiched between a pair of display panel substrates, i.e. an array substrate and an opposed substrate, and controlled by applying voltage selectively to pixels between the array substrate and the opposed substrate to display images on the liquid crystal panel. In an active matrix liquid crystal display panel, for example, an amorphous silicon or polysilicon semiconductor is used for an array substrate to form a Thin-Film Transistor (TFT) as a switching device and simultaneously form pixel electrodes, scan lines, signal lines and so on connected to the switching device. On the other hand, an opposed substrate is formed with opposed electrodes of Indium Tin Oxide (ITO) or the like, color filters, etc.

In the liquid crystal display unit of the structure mentioned above, an external control circuit that feeds display signals is disposed on a circuit board independently of the liquid crystal panel and, for example, a flexible wiring substrate is generally utilized as a lead wire to electrically connect the external control circuit to a circuit formed on the liquid crystal display panel. In this case, since it is required to electrically and mechanically connect an electrode formed on the flexible wiring board to a panel electrode formed on the liquid crystal panel, anisotropic conductive adhesive has widely been used for this connection.

In the aforementioned liquid crystal display unit, with an aim to reduce the weight and thickness thereof, the array substrate has a scan line-operating circuit and a signal line-operating circuit built-in. Particularly, since the signal line-operating circuit has to be operated at higher speed than the scan line-operating circuit, it is formed as an IC chip, for example, and the IC chip is mounted on the array substrate using the Chip On Glass (COG) technique. The IC chip is mounted as being connected onto a panel electrode provided on the outer edge of the array substrate via a bump, receives signals output from an external control circuit and inputs image-controlling signals to the scan lines and signal lines of the array substrate. When mounting this IC chip, anisotropic conductive adhesive has also been used for connection.

The anisotropic conductive adhesive is adhesive having conductive particles dispersed therein. The conductive particles get squashed between the electrodes by pressure application to establish electric conduction between the electrodes. As disclosed in JP-A HEI 10-274778, resin particles plated with metal are used as the conductive particles. The invention of the prior art relates to an electrooptic apparatus equipped with a drive circuit chip attached onto a part-attaching portion via anisotropic conductive adhesive and with a film circuit board. The anisotropic conductive adhesive includes conductive particles having elasticity that comprise elastically deformable resin particles plated with a conductive metal film.

In the case of using the anisotropic conductive adhesive to connect two electrodes, no problem on the connection state will arise when the opposed surfaces of the electrodes are flat. However, when the surface of one of the electrodes is concavoconvex, for example, complete connection between them is not always acquired, resulting in possibly raising problems, such as a rise in connection resistance etc. Such problems are liable to arise particularly when the degree of concavoconvex is large. This is because pressure is difficult to apply to the conductive particles on the concave portions while pressure is infallibly applied to the conductive particles on the convex portions. This difference in pressure applied produces portions where the conductive particles get strongly crushed (convex portions) and portions where they get weakly crushed (concave portions). Sufficient repulsion cannot be obtained at the weakly crushed portions to impair the state of contact with the electrodes, thereby giving birth to a rise in connection resistance. To solve the problem, it is conceivable that the electrodes are pressed against each other so that sufficient pressure may be applied to the conductive particles on the concave portions. In this case, however, the conductive particles on the convex portions will collapse due to the excessive pressing force, leading to failure to acquire sufficient electrical conduction at the convex portions.

The present invention has been proposed in view of the conventional state of affairs described above. An object of the present invention is to provide anisotropic conductive adhesive by which the state of connection between electrodes and conductive particles at both concave and convex portions where the surfaces of the electrode is concavoconvex, is kept good without any rise in connection resistance and therefore to provide a connection structure and a connection method capable of realizing connection low in connection resistance between electrodes and excellent in reliability.

SUMMARY OF THE INVENTION

To attain the above object, the present invention provides anisotropic conductive adhesive having conductive particles dispersed in adhesive and a conductive particle comprising hard particles having conductivity, a resin layer that coats the hard particles and a conductive layer that coats the resin layer; also provides a connection structure connecting electrodes to each other with anisotropic conductive adhesive having conductive particles dispersed in adhesive and a conductive particle comprising hard particles having conductivity, a resin layer that coats the hard particles and a conductive layer that coats the resin layer; and further provides a connection method comprising the steps of causing anisotropic conductive adhesive to intervene between electrodes, applying pressure to the anisotropic conductive adhesive and allowing the adhesive to be solidified.

In the anisotropic conductive adhesive according to the present invention, the conductive particle is characterized greatly in that it has a triple structure comprising a hard particle serving as a nucleus, a resin layer that coats the surrounding of the particle and a conductive layer that coats the outside (surface) of the resin layer. When the electrodes having convexconcave are connected using adhesive containing the conductive particles, the conductive particles contribute to electrical connection between the electrodes at either the convex or the concave portions with exactitude to suppress a rise in connection resistance.

This relies on the following reasons. The electrodes are pressed against each other so that sufficient pressure may be applied to the conductive particles on the concave portions. As a result, the conductive particles on the concave portions get crushed by means of predetermined pressure to give birth to appropriate repulsion, thereby making the state of contact with the electrodes good. Thus, a rise in connection resistance at the concave portions is suppressed.

In the case of the aforementioned pressing action, while excess pressure is applied to the conductive particles on the convex portions to bring the resin layers thereof to a state collapsed by pressure, the hard particles are maintained in shape. Therefore, electrical connection between the electrodes is attained in the presence of the hard particles having conductivity. Thus, electrical connection by the conductive particles at either the concave or the convex portions is achieved to suppress a rise in connection resistance.

The hard particle serves also as a spacer to prevent the conductive particle on the concave portion from being collapsed by pressure. Incidentally, a similar function (function as a spacer) can be materialized by the addition of gap material as disclosed in JP-A HEI 10-274778 cited above. However, the addition of the gap material in addition to the conductive particles will reduce the amount of the conductive particles to be added, resulting in a cause of lowering the reliability of connection.

According to the present invention, even when the surfaces of the electrodes to be connected are concavoconvex, it is possible to make the state of contact between the electrodes and the conductive particles good at either the concave or the convex portions and obtain the state of contact high in reliability without inducing a rise in connection resistance.

The above and other objects, characteristic features and advantages of the present invention will become apparent to those skilled in the art from the description to be made herein below with reference to the accompanying drawings.

DETAILED DESCRIPTION OF THE PREFERRED EMBODIMENT

Anisotropic conductive adhesive to which the present invention is applied and a connection structure, a connection method and a liquid crystal display unit each using the anisotropic conductive adhesive will be described in detail herein below with reference to the accompanying drawings.

The anisotropic conductive adhesive of the present invention has conductive particles dispersed in adhesive similarly to conventional anisotropic conductive adhesive. The adhesive need not be particularly restricted, and any adhesive used for this kind of anisotropic conductive adhesive can be adopted.

Figure 1:
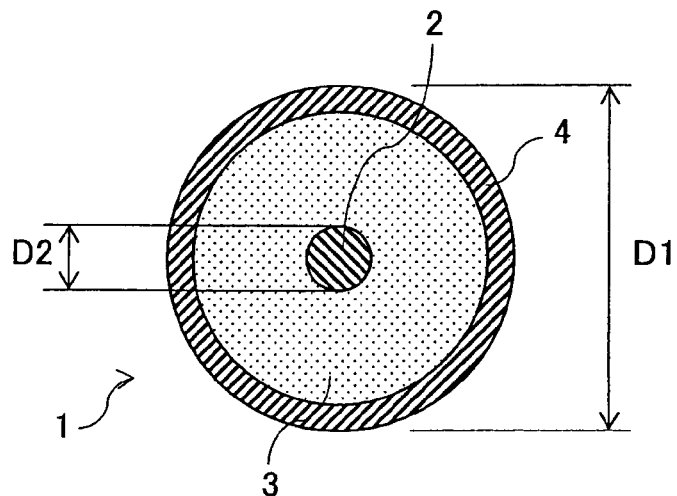
FIG. 1 is a cross-sectional view showing one example of the structure of a conductive particle used for anisotropic conductive adhesive according to the present invention.

The anisotropic conductive adhesive of the present invention is characterized by the configuration of the conductive particles to be dispersed in the adhesive. FIG. 1 shows one example of the configuration of the conductive particle used for the anisotropic conductive adhesive of the present invention. The conductive particle I comprises a hard particle 2 formed at the center thereof as a nucleus, a resin layer 3 coating the hard particle 2 and a conductive layer 4 coating the resin layer 3 to form an outermost layer of the conductive particle 1.

The hard particle 2 is required to have conductivity and can be used in a form of a metal particle or a hard resin particle having its surface plated with a metal film, for example. The hard particle 2, when also adding to a function as a spacer, is required to have prescribed hardness. To be specific, it is preferred to be harder than the resin layer 3 and also harder than the material of which the electrodes to be connected are made. When a metal particle is used as the hard particle 2, therefore, it is preferred to use a hard metal particle, such as a Ni particle, rather than a soft metal particle, such as a solder particle.

Also, the size of the hard particle 2 has to be appropriately set. When it is unduly large relative to the size of the conductive particle 1, there is a possibility of the effect of the configuration adopted being insufficiently manifested. Specifically, when the size of the hard particle 2 is unduly large, there is a possibility of the conductive particle 1 getting insufficiently crushed, resulting in possible unsatisfactory contact between the conductive particle 1 and the electrodes at the concave portions of the electrodes. In view of these, the size of the hard particle 2 (particle size D2) is preferably ⅓ or less the size of the conductive particle 1 (particle size D1). Though the lower limit of the particle size D2 is not particularly restricted, an unduly small size thereof will possibly induce an inconvenience. Therefore and practically, the particle size D2 is ⅕ or more the particle size D1 of the conductive particle 1.

The resin layer 3 coating the hard particle 2 can be made from an optional resin material. However, a resin material having proper elasticity is preferable. When the resin layer 3 can be elastically deformed by pressure application, the area of contact of the conductive particle 1 with the electrodes can be enlarged. This is preferable because the state of electrical contact is made good and the contact resistance can be reduced.

The conductive layer 4 may be any metal film so long as the metal film has conductivity. A metal-plating film is preferred because it is easy to form. The conductive layer (metal-plating film) 4 may be formed to have a thickness of around 0.5 μm or less (e.g., 0.1 μm).

The size of the conductive particle 1 having the aforementioned configuration (particle size D1) may be the same as that of a conventional conductive particle. It may be set at 3 to 6 μm, for example. The conductive particle 1 can be elastically deformed by pressure application so that the flatness ratio thereof falls in the range of 30 to 70%. Therefore, the state of good connection can be obtained owing to the presence of the conductive layer 4. The rate of the conductive particles mixed with the adhesive in the present invention is the same as that of a conventional anisotropic conductive adhesive.

Figure 2:
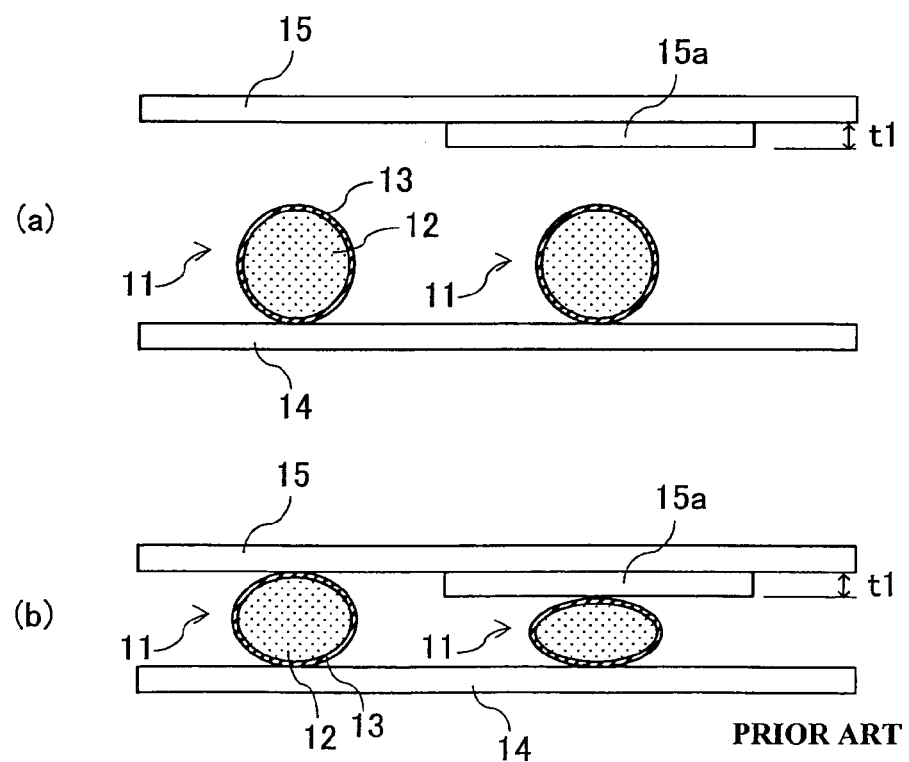
FIG. 2(a) is an explanatory view showing a state before pressure application in the case where a step of an electrode connection surface is small and where conventional anisotropic conductive adhesive is used.
FIG. 2(b) is an explanatory view showing a state after the pressure application in the case of FIG. 2(a).
Figure 3:
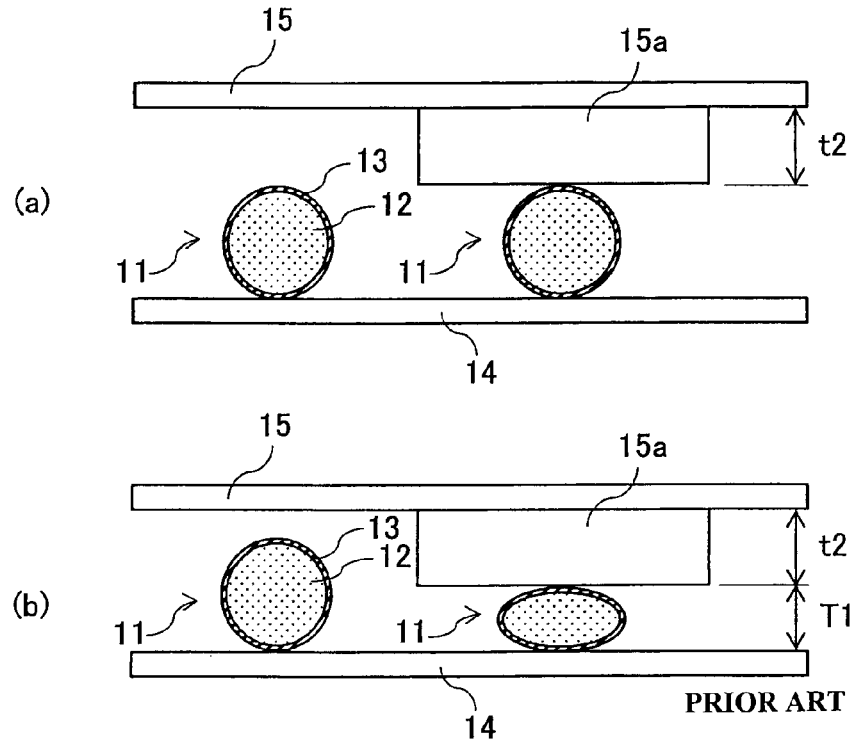
FIG. 3(a) is an explanatory view showing a state before pressure application in the case where a step of an electrode connection surface is large and where conventional anisotropic conductive adhesive is used.
FIG. 3(b) is an explanatory view showing a state after the pressure application in the case of FIG. 3(a).
Figure 4:
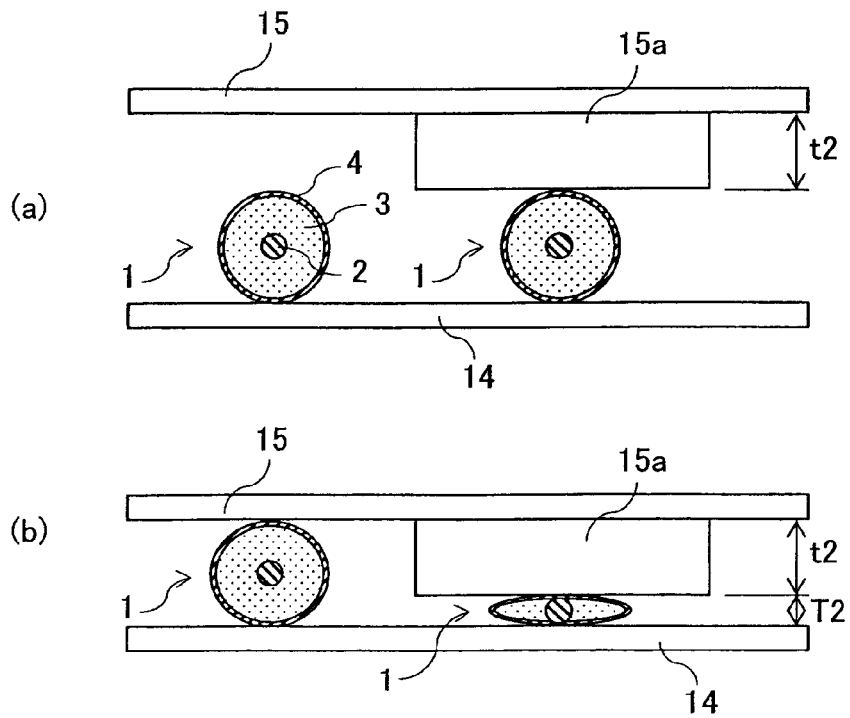
FIG. 4(a) is an explanatory view showing a state before pressure application in the case where a step of an electrode connection surface is large and where anisotropic conductive adhesive according to the present invention is used.
FIG. 4(b) is an explanatory view showing a state after the pressure application in the case of FIG. 4(a).

A connection method and a connection structure using the anisotropic conductive adhesive according to the present invention will be described. FIG. 2 to FIG. 4 illustrate the states of connection using the anisotropic conductive adhesive, and FIG. 2 and FIG. 3 illustrate the states of connection using a conventional anisotropic conductive adhesive while FIG. 4 illustrates the state of connection using the anisotropic conductive adhesive of the present invention. Incidentally, in each of these figures, only the conductive particles dispersed in the adhesive are shown while the adhesive is omitted from illustration.

FIG. 2 shows the state of connection between two electrodes, between which a small step exists, using anisotropic conductive adhesive of a conventional configuration. In the anisotropic conductive adhesive of the conventional configuration, a conductive particle 11 having a resin particle 12 provided thereon with a metal-plating layer 13 is used. The conductive particles 11 are sandwiched between electrodes 14 and 15 and, as shown in FIG. 2(b), a pressure is applied thereto to deform the conductive particles 11, thereby achieving electrical connection between the electrodes 14 and 15. When the height t1 of the convex portion 15a of the connection surface of the electrode 15 is small, as shown in FIG. 2, the conductive particles 11 are deformed at both the convex portion 15a and the concave portion (portion other than the convex portion 15a) to contact the electrodes 14 and 15 with their respective prescribed repulsion, thereby obtaining a good connection state between the electrodes. Where the particle size of the conductive particles 11 is 5 μm and the height t1 of the convex portion 15a formed on the surface of the electrode 15 is 1 μm, for example, when a pressure is applied to the electrodes so that the interval between the convex portion 15a and the electrode 14 may be around 2.5 μm, a good connection state between the electrodes can be obtained.

Where the height t2 of the convex portion formed on the connection surface of the electrode 15 is large (t2=3 μm, for example) as compared with the small height t1, as shown in FIG. 3, use of the pressure application that is the same as in FIG. 2 fails to acquire contact between the conductive particle 11 and the electrode 15 at the concave portion, resulting in a rise in connection resistance. It is conceivable that a pressure be applied to the electrodes so that an interval T1 between the electrode 14 and the convex portion 15a may be smaller in order to solve the problem. In this case, however, the conductive particle 11 on the convex portion 15a is possibly collapsed by the pressure application to fail to carry out the function as the conductive particle, resulting also in a rise in connection resistance.

On the other hand, where the anisotropic conductive adhesive according to the present invention is used, as shown in FIG. 4, even when the height of the convex portion 15a formed on the surface of the electrode 15 is high similarly in the case of FIG. 3, a good connection state between the electrodes can be obtained at both the convex portion 15a and the concave portion. To be specific, when using the anisotropic conductive adhesive according to the present invention, the interval T2 between the convex portion 15a and the electrode 14 can be narrowed to the particle size of the hard particle 2 constituting the conductive particle 1. When the particle size of the hard particle 2 is 1.5 μm, for example, a pressure can be applied until the interval T2 becomes 1.5 μm.

In the state mentioned above, since the interval between the electrodes 14 and 15 at the concave portion is also narrowed, the conductive particle 1 on the concave portion is pressurized and deformed, thereby allowing the conductive particle to contact the electrodes with prescribed repulsion to obtain a good connection state between the electrodes. While there is a possibility of the conductive layer 4 and resin layer 3 of the conductive particle 1 on the convex portion 15a being collapsed by the pressure application, the convex portion 15a and the electrode 14 are electrically connected to each other via the hard particle 2 having conductivity. In the case of using the anisotropic conductive adhesive according to the present invention, therefore, even when the convex portion 15a formed on the connection surface of the electrode 15 has a large height, a good connection state can be obtained at both the convex portion 15a and the concave portion, thus making it possible to suppress a rise in connection resistance.

Figure 5:
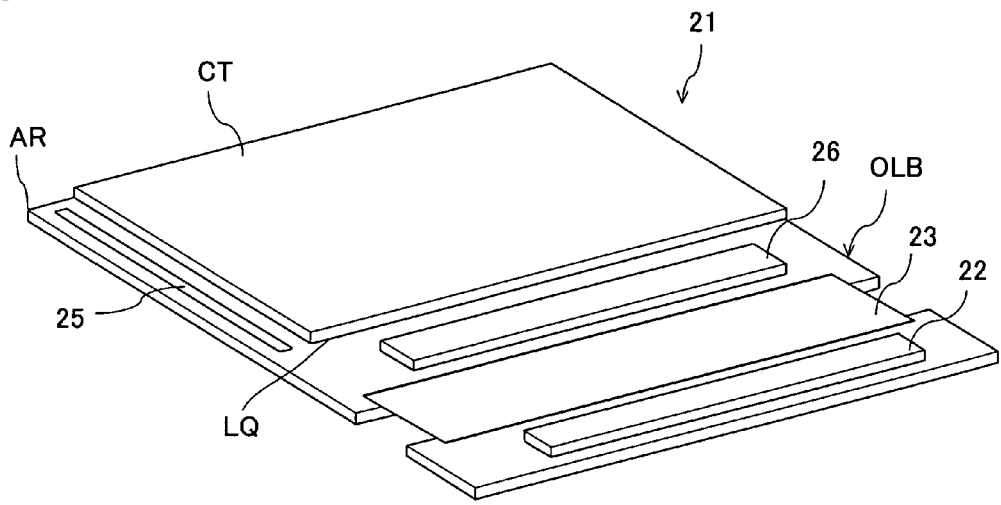
FIG. 5 is a schematic perspective view showing one example of a liquid crystal display panel.
Figure 6:
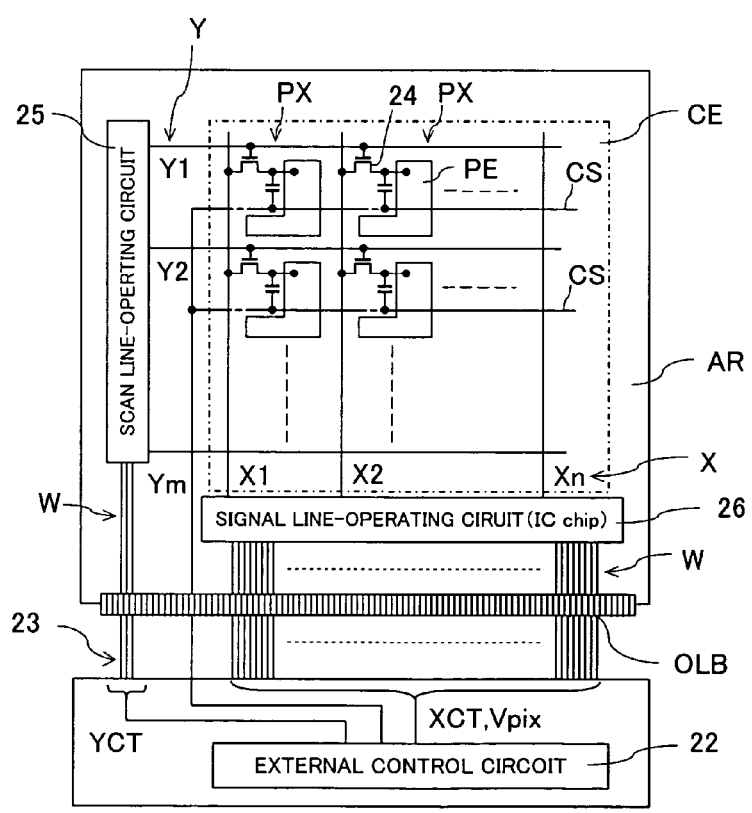
FIG. 6 is a diagram showing one example of the circuit configuration of a liquid crystal display unit.

Connection by the anisotropic conductive adhesive is advantageously applied to a liquid crystal display unit. The configuration of the liquid crystal display unit will now be described. FIG. 5 schematically shows one example of a liquid crystal display panel of a liquid crystal display unit. FIG. 6 shows a schematic circuit structure of the liquid crystal display unit shown in FIG. 5.

The liquid crystal display unit is equipped with a liquid crystal display panel 21 and an external control circuit 22 that controls the liquid crystal display panel 21. The liquid crystal display panel 21 has a structure in which a liquid crystal layer LQ thereof is retained between a pair of display panel substrates, i.e. an array substrate AR and an opposed substrate CT. The external control circuit 22 is disposed on a circuit substrate independent of the liquid crystal display panel 21 and connected to internal circuits of the liquid crystal display panel 21 via a flexible substrate 23.

The array substrate AR includes (m×n) number of pixel electrodes PE disposed in matrix form, m number of scan lines Y (Y1 to Ym) formed along the rows of the plurality of pixel electrodes PE, n number of signal lines X (X1 to Xn) formed along the columns of the respective pixel electrodes PE, (m×n) number of pixel switches 24 disposed in the neighborhood of positions of intersections between the signal lines X1 to Xn and the scan lines Y1 to Ym and formed each of an N-channel thin-film transistor of polysilicon, for example, sub-capacity lines CS disposed parallel to the scan lines Y1 to Ym and connected in capacity to the corresponding rows of pixel electrodes PE, a scan line-operating circuit 25 for operating the scan lines Y1 to Ym, an IC chip 26 constituting a signal line-operating circuit for operating the signal lines X1 to Xn and a plurality of connection pads OLB used for connection between the external control circuit 22 and the array substrate AR.

The opposed substrate CT includes a single opposed electrode CE disposed as facing the (m×n) number of pixel electrodes PE and set to have a common potential Vcom. The common potential Vcom is also applied to the sub-capacity lines CS, for example.

The external control circuit 22 receives digital image signals and synchronized signals fed from a processing circuit of a mobile device and generates pixel display signals Vpix, vertical scanning control signals YCT and horizontal scanning control signals XCT. The vertical scanning control signals VCT are fed to the scan line-operating circuit 25, and the horizontal scanning control signals XCT are fed together with the pixel display signals Vpix to the IC chip 26 constituting the signal line-operating circuit. The scan line-operating circuit 25 is controlled with the vertical scanning control signals YCT so that it may feed scanning signals sequentially to the scan lines Y1 to Ym every one vertical scanning (frame) period. The built-in signal line-operating circuit of the IC chip 26 is controlled with the horizontal scanning control signals XCT so that it may make series-parallel conversion of digital image signals input during the one horizontal scanning period (1H) in which the individual scan lines Y are operated with the scanning signals and further feed the digital-analog-converted display signals Vpix to the signal lines X1 to Xn, respectively, in analog format.

In the liquid crystal display unit, the liquid crystal layer LQ is partitioned into (m×n) number of display pixels PX corresponding in number to (m×n) number of pixel electrodes PE. Each of the display pixels PX is defined by two adjacent scan lines Y and by two adjacent signal lines X. A display screen is constituted by the (m×n) display pixels PX. The scan line-operating circuit 25 and IC chip 26 having the signal line-operating circuit built-in are disposed, as shown in FIG. 5 and FIG. 6, outside the (m×n) number of display pixels PX, and the plurality of connection pads OLB are disposed on the peripheral edge of the array substrate AR. The IC chip 26 having the signal line-operating circuit built-in is disposed at a position closer to the liquid crystal display panel 21 than the position of these connection pads. Each pixel switch 24 replies to a scanning signal from a corresponding scan line Y to sample a display signal Vpix from a corresponding signal line X and applies the sampled signal to a corresponding pixel electrode PE to control the light transmission of a corresponding pixel PX based on a difference in potential between the pixel electrode PE and the opposed electrode CE.

In the liquid crystal display unit having the structure described above, use of the anisotropic conductive adhesive according to the present invention for connection of the flexible substrate 23 to the panel electrode of the liquid crystal display panel 21 and for mounting the IC chip 26 that is a part enables a good connection state to be obtained.

What is claimed is:

1. A liquid crystal display unit having two electrodes and a connection structure,
   wherein at least one of the two electrodes has a concavoconvex connection surface,
   wherein the electrodes are electrically connected to each other with anisotropic conductive adhesive having conductive particles dispersed in adhesive,
   each of said conductive particles having:
   a hard metal core having conductivity formed at the center thereof as a nucleus,
   a resin layer coating the hard metal cord, and
   a conductive layer coating the resin layer to form an outermost layer of the conductive particle, and
   wherein the hard metal core is composed of Ni, and
   the Ni core is $\frac{1}{3}$ or less the size of the conductive particle, and
   the Ni core is $\frac{1}{5}$ or more the size of the conductive particle.

2. A liquid crystal display unit as recited in claim 1 wherein the conductive particles can be elastically deformed by pressure application so that the flatness ratio thereof falls in the range of 30 to 70%.

\* \* \* \* \*